US008888982B2

(12) United States Patent
Chen et al.

(10) Patent No.: US 8,888,982 B2
(45) Date of Patent: Nov. 18, 2014

(54) REDUCTION OF COPPER OR TRACE METAL CONTAMINANTS IN PLASMA ELECTROLYTIC OXIDATION COATINGS

(75) Inventors: Xing Chen, Lexington, MA (US);
Chengxiang Ji, Waltham, MA (US);
Chiu-Ying Tai, Chelmsford, MA (US)

(73) Assignee: MKS Instruments Inc., Andover, MA (US)

( * ) Notice: Subject to any disclaimer, the term of this patent is extended or adjusted under 35 U.S.C. 154(b) by 884 days.

(21) Appl. No.: 12/794,470

(22) Filed: Jun. 4, 2010

(65) Prior Publication Data

US 2011/0297319 A1 Dec. 8, 2011

(51) Int. Cl.
| C23C 28/00 | (2006.01) |
| C25D 11/04 | (2006.01) |
| C25D 11/16 | (2006.01) |
| C25D 11/02 | (2006.01) |
| H01J 37/32 | (2006.01) |
| H01J 37/16 | (2006.01) |
| C25D 5/48 | (2006.01) |

(52) U.S. Cl.
CPC .............. C25D 11/04 (2013.01); C23C 28/321 (2013.01); C25D 11/16 (2013.01); C25D 11/026 (2013.01); H01J 37/32431 (2013.01); H01J 37/16 (2013.01); H01J 37/32467 (2013.01); H01J 37/32357 (2013.01); C25D 5/48 (2013.01)
USPC ........... 205/190; 205/188; 205/220; 205/324; 205/325

(58) Field of Classification Search
USPC ......................... 205/325, 190, 220
See application file for complete search history.

(56) References Cited

U.S. PATENT DOCUMENTS

| 4,078,712 A * | 3/1978 | Cook et al. ..................... 228/170 |
| 4,090,873 A * | 5/1978 | Takamura et al. ................ 419/8 |
| 4,263,113 A | 4/1981 | Bernard |
| 5,756,222 A | 5/1998 | Bercaw et al. ................ 428/649 |
| 5,811,195 A | 9/1998 | Bercaw et al. ................ 428/472 |
| 5,872,696 A * | 2/1999 | Peters et al. .................. 361/305 |
| 6,066,392 A | 5/2000 | Hisamoto et al. |
| 6,197,178 B1 | 3/2001 | Patel et al. |

(Continued)

FOREIGN PATENT DOCUMENTS

| JP | H02-221394 | 4/1990 |
| JP | H07-086185 | 3/1995 |

(Continued)

OTHER PUBLICATIONS

Ponnekanti et al., "Failure mechanisms of anodized aluminum parts used in chemical vapor deposition chambers," J. Vac.Sci. Technol., A14(3), (May/Jun. 1996), pp. 1127-1131.*

(Continued)

Primary Examiner — James Lin
Assistant Examiner — William Leader
(74) Attorney, Agent, or Firm — Proskauer Rose LLP

(57) ABSTRACT

A method for creating an oxide layer having a reduced copper concentration over a surface of an object comprising aluminum and copper for use in a semiconductor processing system. The oxide layer produced using a plasma electrolytic oxidation process has a reduced copper peak concentration, which decreases a risk of copper contamination, and includes magnesium oxides that can be converted to magnesium halide upon exposure to an excited halogen-comprising gas or halogen-comprising plasma to increase the erosion/corrosion resistance of the oxide layer.

7 Claims, 10 Drawing Sheets

(56) References Cited

U.S. PATENT DOCUMENTS

| | | | |
|---|---|---|---|
| 6,558,806 B2 | 5/2003 | Watanabe | 428/469 |
| 6,565,984 B1 | 5/2003 | Wu et al. | 428/472.2 |
| 6,632,325 B2 | 10/2003 | Lingampalli | 156/345.51 |
| 6,699,375 B1 | 3/2004 | Crocker | 204/298.15 |
| 6,896,785 B2 | 5/2005 | Shatrov et al. | 205/109 |
| 7,033,447 B2 | 4/2006 | Lin et al. | 148/440 |
| 7,048,814 B2 | 5/2006 | Lin et al. | 148/518 |
| 7,291,566 B2 | 11/2007 | Escher et al. | 438/758 |
| 7,396,446 B2 | 7/2008 | Mawston | 205/108 |
| 2003/0150419 A1 | 8/2003 | Daragheh et al. | 123/193.6 |
| 2004/0050490 A1* | 3/2004 | Hasuo et al. | 156/345.1 |
| 2007/0207267 A1* | 9/2007 | Laube | 427/230 |
| 2008/0241517 A1 | 10/2008 | Kenworthy et al. | |
| 2010/0028572 A1 | 2/2010 | Kobayashi et al. | |

FOREIGN PATENT DOCUMENTS

| | | |
|---|---|---|
| JP | H07-180091 | 7/1995 |
| JP | H11-061410 | 3/1999 |
| JP | 2003-171727 A * | 6/2003 |
| JP | 03608707B2 B2 | 1/2005 |
| JP | 2005179730 | 7/2005 |
| JP | 2008179884 | 8/2008 |
| JP | 2001220637 | 8/2014 |
| WO | WO 2005/014892 A2 | 2/2005 |
| WO | WO 2007/092611 A2 | 6/2007 |

OTHER PUBLICATIONS

Curran, "The KERONITE Process: Structure and Properties," Keronite International Limited, (20060, 31 pages.*

Tai et al., U.S. Appl. No. 12/499,453, filed Jul. 8, 2009.

Ponnekanti et al., "Failure mechanisms of anodized aluminum parts used in chemical vapor deposition chambers," *J. Vac. Sci. Technol.* A14(3), (May/Jun. 1996), pp. 1127-1131.

Curran, J.A., "The KERONITE Process: Structure and Properties," Keronite International Ltd., (2006), 31 pages.

"Microarc Oxidation (MAO) Process: An in house evaluation by METALAST International, Inc.," *Metalast Technical Bulletin*, (2000), 8 pages.

Kim, B-Y et al., "Effect of Al Alloy Composition on Physical and Cristallographical Properties of Plasma Electrolytic Oxidized Coatings, I. Physical Properties of PEO Layer," Journal of the Korean Ceramic Society, May 2010, pp. 256-261, vol. 47, No. 3.

Wang, K., et al, "Ceramic Coatings on 6061 Al Alloys by Plasma Electrolytic Oxidation under Different AC Voltages", Journal of Ceramic Processing Research, 2009, pp. 562-566, vol. 10. No. 4.

* cited by examiner

US 8,888,982 B2

REDUCTION OF COPPER OR TRACE METAL CONTAMINANTS IN PLASMA ELECTROLYTIC OXIDATION COATINGS

TECHNICAL FIELD

This disclosure relates to plasma chambers and semiconductor process chambers with protective coatings for use with reactive gas sources and methods for creating protective layers to protect surfaces of objects. More specifically, the disclosure relates to protective layers produced using a plasma electrolytic oxidation process that have reduced levels of copper or other trace metal contaminants. A protective layer formed using the disclosed methods may protect an aluminum object from some corrosive environments and have a reduced concentration of copper.

BACKGROUND

Plasmas are often used to activate gases placing them in an excited state so that they have an enhanced reactivity. In some cases, the gases are excited to produce dissociated gases containing ions, free radicals, atoms and molecules. Dissociated gases are used for numerous industrial and scientific applications including processing materials such as semiconductor work pieces (e.g., wafers), powders, and other gases. The parameters of the dissociated gas and the conditions of the exposure of the dissociated gas to the material being processed vary widely depending on the applications.

Plasma reactors for processing semiconductor wafers may form a plasma within a chamber containing the wafer, or they may receive excited gases produced by a reactive gas generator located upstream of the chamber. The preferred location of plasma generation relative to the wafer location depends on the process.

In some processes the plasma affects the wafer through direct contact between the plasma and the wafer. Direct contact may be desirable because a wafer in contact with a plasma generally has increased chemical reactivity due to the presence of electrons and ions in the plasma. Further, when plasma is in contact with the wafer, it is possible to control the energy and direction of ions at the wafer surface by applying a bias voltage to the wafer. Such arrangements are used in, for example, plasma-enhanced chemical vapor deposition or directional etching applications.

In other processes, plasma is generated away from the wafer, and then excited gases from the plasma come into contact with the wafer. For semiconductor processes in which the wafer is sensitive to electric charges in a plasma, susceptible to ultraviolet energy (UV) damage generated by the plasma, or which require high chemical selectivity, exposing the wafer to the plasma can be undesirable. In some situations, the wafer and the plasma chamber surfaces can be damaged by exposure to chemically corrosive plasmas, which may create chemical contamination and particle generation, shorten the product life and increase cost of ownership. Accordingly, remote plasma sources are sometimes used to reduce wafer and chamber damage by generating plasma outside the process chamber and then delivering activated gases produced by the plasma to the processing chamber for processing the wafer.

Reactive gas generators generate plasmas by, for example, applying an electric potential of sufficient magnitude to a plasma gas (e.g., $O_2$ $N_2$, Ar, $NF_3$, $F_2$, $H_2$ and He), or a mixture of gases, to ionize at least a portion of the gas. Plasmas can be generated in various ways, including DC discharge, radio frequency (RF) discharge, and microwave discharge. DC discharge plasmas are achieved by applying a potential between two electrodes in a plasma gas. RF discharge plasmas are achieved either by electrostatically or inductively coupling energy from a power supply into a plasma. Microwave discharge plasmas are achieved by directly coupling microwave energy through a microwave-passing window into a discharge chamber containing a plasma gas. Plasmas are typically contained within chambers having chamber walls that are composed of metallic materials such as aluminum, or dielectric materials such as quartz, sapphire, yttrium oxide, a zirconium oxide, and/or an aluminum nitride. The plasma chamber can include a metal vessel having walls coated with a dielectric material.

In some applications a plasma or an excited gas may not be compatible with the reactive gas generator and/or the semiconductor processing system. For example, during semiconductor manufacturing, ions or atoms of fluorine or fluorocarbons may be used for etching or removing silicon or silicon oxides from surfaces of semiconductor wafers or for cleaning process chambers. Because the fluorine ions are chemically reactive and corrosive to process chamber materials, remote plasma sources have been used to generate atomic fluorine for these processes to avoid damaging the process chamber. Although the use of a remote plasma source reduces corrosion/erosion in the process chamber, some corrosion/erosion still occurs in the remote plasma source.

In another example, atomic oxygen is used to remove photoresist from a semiconductor wafer by converting the photoresist in to volatile $CO_2$ and $H_2O$ byproducts. Atomic oxygen is typically produced by dissociating $O_2$ (or a gas containing oxygen) with a plasma in a plasma chamber of a reactive gas generator. Atomic fluorine is often used in conjunction with atomic oxygen because the atomic fluorine accelerates the photoresist removal process. Fluorine is generated by, for example, dissociating $NF_3$ or $CF_4$ with the plasma in the plasma chamber. Fluorine, however, is highly corrosive and can adversely react with various materials used for chambers, such as aluminum.

A problem that plagues many different types of equipment used in semiconductor fabrication, including plasma chambers, is copper contamination. Because copper is a "fast diffuser" (i.e., has a higher diffusion rate in typical semiconductor materials than many other elements), introducing very small amounts of copper in semiconductor fabrication equipment can cause failure of semiconductor devices. Further, small amounts of copper can be easily transferred from one piece of equipment to another, thereby spreading and contaminating semiconductor fabrication equipment in a fabrication line.

A need therefore exists for improved protective coatings that are less susceptible to the corrosive affects of excited gases located in a plasma chamber without contributing to the problem of copper contamination.

SUMMARY

In general, in one aspect, some exemplary embodiments of the invention are directed to methods of manufacturing an oxide coating on an object (e.g., a chamber wall) using a plasma electrolytic oxidation (PEO) process, where the coating has a reduced surface copper concentration, and a maintained or high magnesium concentration to supply sufficient magnesium that can be converted to magnesium halide in later processing. The combination of a reduced or low copper concentration and an increased or high magnesium concentration in an oxide coating or an object for use in semiconductor processing equipment provides not only increased corrosion/erosion resistance, but also increased yield as copper contamination is reduced.

In another aspect, embodiments of the invention are directed to plasma or semiconductor process chambers, which include an object with an oxide layer that has a combination or a reduced/low copper concentration and an increased/high magnesium concentration.

In another aspect, the disclosure provides a method of creating an oxide layer over a surface of an object including aluminum, copper and magnesium for use in a semiconductor processing system. In an embodiment of this aspect, the method includes providing the object where the object includes a bulk material having a bulk copper concentration between about 0% and about 0.1% by weight and a bulk magnesium concentration greater than about 1.5% by weight. The method also includes oxidizing the surface of the object using a plasma electrolytic oxidation process to form the oxide layer comprising alumina and an oxide of magnesium. By providing an object with a bulk material having a reduced copper concentration and a relatively high magnesium concentration, less copper is available to be incorporated into the oxide layer as a contaminant during the plasma electrolytic oxidation process and additional magnesium is available to be incorporated into the oxide layer, which can be converted to magnesium halide in further processing.

In some embodiments, the method further includes depositing a layer of a second material having a second copper concentration less than the bulk copper concentration on the surface of the object. Oxidizing the surface of the object using a plasma electrolytic oxidation process includes oxidizing at least a portion of a thickness of the layer of second material. Oxidizing the surface can include oxidizing through a thickness of the layer of second material or oxidizing through and beyond a thickness of the layer of second material into underlying bulk material of the object.

In some embodiments, the surface of the object can be cleaned prior to depositing the layer of second material. In some embodiments, a magnesium concentration of the layer of second material is increased before formation of the oxide layer. The magnesium concentration can be increased through an ablative transfer of magnesium or another suitable method.

In some embodiments, copper is removed or extracted from a surface of the oxide layer after formation of the oxide layer. The method can further include removing material from the surface of the object to a first depth after oxidizing the surface of the object using the plasma electrolytic oxidation process. A maximum copper concentration of the oxidized layer is about or less than about 5000 ppm after the material is removed from the surface of the object to the first depth. A magnesium concentration at the first depth is at least about 4000 ppm after the material is removed from the surface of the object to the first depth.

In another embodiment of this aspect, a method for creating an oxide layer over a surface of an object including aluminum, copper and magnesium is provided includes providing the object that includes a bulk material having a bulk copper concentration by weight and depositing a layer of a second material, which has a second copper concentration smaller than the bulk copper concentration, on the surface of the object. The method further includes oxidizing at least an outer thickness of the deposited layer using a plasma electrolytic oxidation process. In some embodiments, the magnesium concentration in the second material can be larger than a bulk magnesium. The method can further include increasing the magnesium concentration in the layer of second material.

In yet another embodiment of this aspect, a method for creating an oxide layer over a surface of an object comprising aluminum, copper and magnesium is provided includes providing the object, which includes a bulk material having a bulk copper concentration by weight and a bulk magnesium concentration by weight, and contacting the object with a layer of second material, which has a second copper concentration smaller than the bulk copper concentration. The method also includes heating the object to diffuse copper from the bulk material into the layer of second material, removing the layer of second material from the object, and oxidizing the surface of the object using a plasma electrolytic oxidation process. In some embodiments, contacting the object with a layer of second material can include depositing the layer of the second material on the surface of the object. In other embodiments contacting the object with a layer of second material includes physically moving an amount of second material until the amount of second material contacts the surface of the object.

In another aspect, methods for treating a surface of an object comprising aluminum, copper and magnesium for use in a semiconductor processing system are provided. In an embodiment of this aspect, a method includes providing an object having a bulk region and an oxide layer and removing a portion of the oxide layer. The bulk region includes copper, aluminum and magnesium. The oxide layer is produced by a plasma electrolytic oxidation process and has a magnesium concentration and a copper concentration that each varies as a function of depth in the oxide layer with a maximum copper concentration of greater than about 5000 ppm at a first depth. The portion of the oxide layer is removed to beyond the first depth to a second depth at which the copper concentration is about or less than about 5000 ppm and the magnesium concentration is greater than about 4000 ppm. In some embodiments, a copper concentration at the second depth is about or less than about 5000 ppm. In some embodiments, the portion of the oxide layer is removed using a chemical-mechanical process, a mechanical process, chemical etching, an electrochemical-mechanical process or any combination of the aforementioned.

In another embodiment of this aspect, the method includes providing an object including a bulk region and an oxide layer and extracting copper from the oxide layer. The bulk region includes copper and aluminum. The oxide layer is produced by a plasma electrolytic oxidation process and has a copper concentration that varies as a function of depth in the oxide layer. The copper is extracted from the oxide layer until a maximum copper concentration in the oxide layer is about or less than about 5000 ppm. In some embodiments, the copper is extracted from the oxide layer until the maximum copper concentration in the oxide layer is about or less than about 4000 ppm. In some embodiments, the copper is extracted using a chemical process or an electrochemical process. In some embodiments, a magnesium concentration in the oxide layer is increased using an ablative transfer process or by doping the oxide layer.

In another embodiment of this aspect, the method includes providing an object including a bulk region and an oxide layer and applying energy to the object to diffuse copper. The bulk region includes aluminum and has a bulk copper concentration. The oxide layer is produced by a plasma electrolytic oxidation process. The oxide layer has magnesium concentration that varies as a function of depth in the oxide layer and a copper concentration that varies as a function of depth in the oxide layer with a maximum copper concentration greater than the bulk copper concentration. Energy is applied to the object to diffuse copper at least until a maximum copper concentration of the oxide layer is about or less than about 5000 ppm. In some embodiments energy is applied to the object to diffuse copper at least until the maximum copper concentration of the oxide layer is about or less than about 4000 ppm.

In some embodiments, applying energy to the object to diffuse copper includes applying an electrical potential gradient across the oxide layer; and heating the object to enhance diffusion of the copper. In some embodiments, the electrical voltage applied across the oxide layer is between about 300 V and about 1000 V. In some embodiments, the electrical voltage across the oxide layer is between about 30% and about 80% of the breakdown voltage of the oxide layer. In some embodiments, heating the object to enhance diffusion of the copper includes heating the object to a temperature between about 50 C. and about 350 C. Applying an electrical potential gradient across the oxide layer can further include providing an electrolyte adjacent the surface of the oxide layer for electrical connection to the surface of the object. The electrolyte can be an electrically conductive polymer.

In some embodiments, applying energy to the object to diffuse copper includes heating at least a portion of the object to a temperature in a temperature range between a minimum temperature that permits diffusion of the copper on a production time scale and a maximum temperature lower than a temperature that permits diffusion of magnesium on the production time scale. Applying energy further can include maintaining the portion of the object in the temperature range at least until a maximum copper concentration in the oxide layer is about or less than about 5000 ppm. In some embodiments, the temperature range is between about 150 C. and 350 C.

In another aspect, a method of creating a protective layer over a surface of an object including aluminum, magnesium and copper for use in a semiconductor processing system is provided. The method includes providing the object that includes a bulk material having a bulk copper concentration and an oxide layer produced using a plasma electrolytic oxidation process and exposing a surface of the oxide layer to an excited gas comprising a halogen or to a plasma comprising a halogen. The oxide layer has a copper concentration varying as a function of depth with a maximum copper concentration being about or less than about 5000 ppm and a magnesium concentration varying as a function of depth with a minimum magnesium concentration being more than about 4000 ppm. When the surface of the oxide layer is exposed to an excited gas comprising a halogen or to a plasma comprising a halogen, magnesium halide is formed in the oxide layer thereby creating the protective layer. In some embodiments, the maximum copper concentration in the oxide layer is about or less than about 4000 ppm. In some embodiments bulk copper concentration is greater than about 0.1% by weight and/or the bulk magnesium concentration is less than about 1% by weight.

In another aspect, a plasma chamber for use with a reactive gas source is provided. The plasma chamber includes an inlet for receiving a gas and at least one plasma chamber wall for containing the gas, and an outlet for outputting a reactive gas generated by the interaction of the plasma and the gas. The plasma chamber wall includes a bulk material having a bulk copper concentration and an oxide layer produced using a plasma electrolytic oxidation process. The oxide layer has a copper concentration that varies as a function of depth in the oxide layer with a maximum copper concentration being about or less than about 5000 ppm and a magnesium concentration that varies as a function of depth in the oxide layer with a minimum magnesium concentration being more than about 4000 ppm. In some embodiments, the maximum copper concentration is about or less than about 4000 ppm.

In yet another aspect, a semiconductor process chamber for use with a reactive gas source is provided. The semiconductor process chamber includes an inlet for receiving an excited gas or a plasma and at least one process chamber wall for containing the gas. The process chamber wall includes a bulk material having a bulk copper concentration and an oxide layer produced using a plasma electrolytic oxidation process. The oxide layer includes a copper concentration that varies as a function of depth in the oxide layer with a maximum copper concentration being about or less than about 5000 ppm and a magnesium concentration that varies as a function of depth in the oxide layer with a minimum magnesium concentration being more than about 4000 ppm. In some embodiments, the maximum copper concentration is about or less than about 4000 ppm.

BRIEF DESCRIPTION OF THE DRAWINGS

In the drawings, like reference characters generally refer to the same parts throughout the different views. Also the drawings are not necessarily to scale, emphasis instead being placed upon illustrating the principles of the disclosure.

DETAILED DESCRIPTION

Figure 1A:
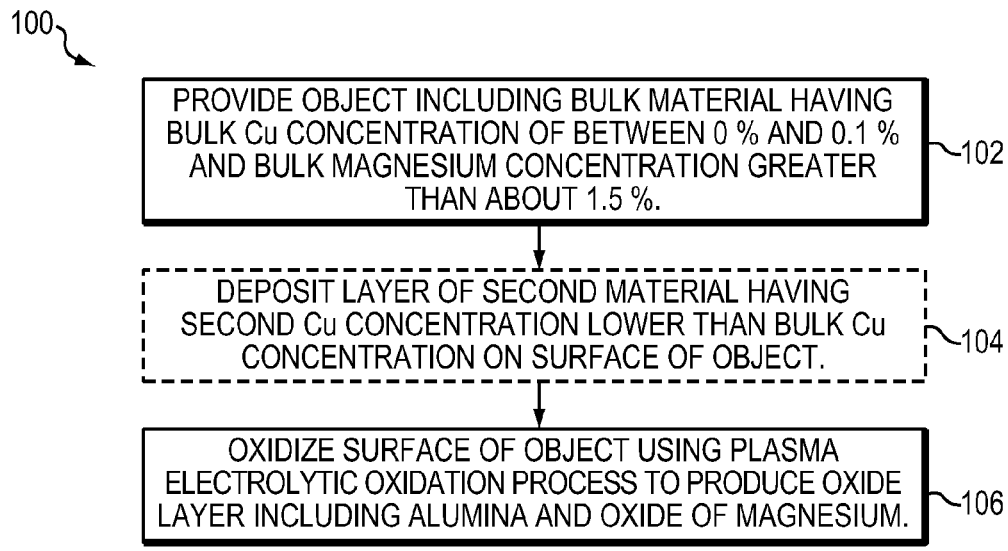
FIG. 1A is a flow chart illustrating a method of creating an oxide layer having a reduced copper concentration over a surface of an object using plasma electrolytic oxidation (PEO), according to an illustrative embodiment.

Protective layers created using plasma electrolytic oxidation (PEO) processes on metal surfaces are more resistant to corrosion/erosion than protective layers produced using conventional anodic oxidation. For example, the corrosion/erosion rates of coatings produced by plasma electrolytic oxidation are generally 2-5 times lower than corrosion/erosion rates of similar coatings produced by type III hard anodization. As a result, in plasma generators utilizing aluminum materials for the plasma chamber, PEO can be applied to chamber surfaces to increase corrosion/erosion resistance. Methods for forming oxide coatings using PEO processes are described in U.S. patent application Ser. No. 12/499,453 (hereinafter "the '453 application"), filed Jul. 8, 2009, and entitled "Methods and Apparatus for Protecting Plasma Chamber Surface," the entire contents of which is incorporated herein by reference. Applicants realized that although an oxide layer formed by a PEO process on an object of a commonly used aluminum alloy (e.g., aluminum 6061) has increased corrosion/erosion resistance, the process of forming the oxide layer may result in a higher copper concentration at a surface of the oxide layer than in the bulk of the object. Applicants have observed that copper concentrations in oxide coatings produced using a PEO process are highest at or near the surface of the coating and generally decrease with increasing depth. The peak copper concentration in the oxide layer can be higher than the copper concentration in the bulk material that the layer covers. As explained above, small concentrations of copper can cause defects in semiconductor processing due to copper's high diffusion rate in silicon. Copper concentrated at a surface of an object, such as a chamber wall, in a semiconductor processing system, can be especially problematic due to the risk of transferring copper from the object to a sample, such as a wafer, or to other semiconductor processing equipment. Thus, despite its improved corrosion/erosion resistance, an increased copper concentration at a surface of an oxide coating on an object produced using a PEO process could render the object unsuitable for use in some semiconductor processing environments due to the increased risk of copper contamination. Accordingly, exemplary embodiments are directed to methods of manufacturing a protective PEO oxide coating having a reduced copper concentration.

Many common aluminum alloys include small concentrations of copper and other elements like silicon, iron, chromium, magnesium, manganese, zinc, titanium, etc. Some methods of reducing the concentration of a "contaminant" like copper may also reduce concentrations of other elements in the aluminum alloy. The '453 application explains that a protective oxide layer produced using a plasma electrolytic oxidation process (a PEO layer) and including a substantial amount of magnesium halide has increased resistance to corrosion/erosion than a PEO layer with less magnesium halide. The '453 application describes forming a protective PEO layer with magnesium halide on an aluminum alloy object having a magnesium concentration of between about 1 and about 6 percent by weight by forming a PEO layer on the object and then exposing the PEO layer to a plasma or an excited gas that includes a halide. Applicants observed that performing a PEO process on an object of an aluminum alloy can result in a PEO layer with an increased magnesium concentration relative to the magnesium concentration of the bulk aluminum alloy. However, the PEO process can also result in an oxide layer with an increased copper concentration at or near the surface relative to the copper concentration of the bulk aluminum alloy, which is undesirable. Accordingly, exemplary embodiments are directed to methods of manufacturing an oxide coating on an object using a PEO process, where the coating has a peak copper concentration comparable to or lower than the concentration of copper in a bulk of the object and a maintained or increased magnesium concentration relative to the magnesium concentration in the bulk of the object.

Embodiments described herein are useful for creating protective layers over the surfaces of objects used in semiconductor processing. For example, a protective layer covering an interior wall of a plasma source in a semiconductor processing system can reduce surface erosion (e.g., melting, vaporization, sublimation, corrosion, sputtering of the material beneath the protective layer) of the interior wall. Reducing surface erosion ultimately reduces particle generation and contamination of processes performed in the semiconductor processing system. As another example, the protective layer can also reduce the loss of reactive gases that could otherwise occur due to surface reaction or recombination of the reactive gas on the interior wall of the plasma source.

The protective layer also broadens the types of plasma chemistries that can be operated in a plasma source. The protective layer makes the plasma chamber better capable of operating (e.g., producing fewer contaminants) in hydrogen, oxygen or nitrogen based chemistries (e.g., $H_2O$, $H_2$, $O_2$, $N_2$,), halogen based chemistries (e.g., $NF_3$, $CF_4$, $C_2F_6$, $C_3F_8$, $SF_6$, $Cl_2$, $ClF_3$, Br) and in a mixture and/or rapid cycling of halogen, hydrogen, oxygen or nitrogen based chemistries and Ar-ignition steps. The protective layer therefore extends operation of the plasma sources to higher power levels, improves the dielectric breakdown voltage of the object through the presence of the layer, and ultimately lowers product cost and cost of ownership.

In general, embodiments described herein provide objects with oxide layers having reduced peak copper concentrations, which reduces risk of copper contamination, and having maintained or increased magnesium concentrations, which provides magnesium for formation of magnesium halide in the oxide layers to increase corrosion/erosion resistance of the oxide layers. In some embodiments, a copper concentration of an oxide layer of an object is reduced and a magnesium concentration of the oxide layer is raised or maintained through selection of the copper concentration and magnesium concentration of a bulk material of the object before the object undergoes a PEO process. In some embodiments, a layer of a second material having a reduced copper concentration and a raised or maintained magnesium concentration is deposited on the object, and then at least a portion of the layer of second material is oxidized using a PEO process. Some embodiments employ diffusion at elevated temperatures to reduce a copper concentration of a bulk material of an object at least near a surface of the object before the surface of the object is oxidized using a PEO process.

In some embodiments, a peak copper concentration of an oxide layer is reduced and a magnesium concentration of the oxide layer is maintained or increased after formation of the oxide layer using a PEO process. For example, copper may be extracted from the oxide layer using a variety of methods (e.g., dissolution of copper in a solution). As another example, a peak copper concentration in the oxide layer may be reduced by raising the temperature of the object to a temperature high enough to diffuse the copper in the oxide layer causing a more even distribution. In yet another example, a peak copper concentration in the oxide layer may be reduced by raising the temperature of at least a portion of the object and applying a voltage across the oxide layer to drive the copper away from the surface using electromigration. In some embodiments, a peak copper concentration is reduced by removing an outer portion of the oxide layer that includes the maximum copper concentration. In some embodiments, multiple different methods and techniques are combined to reduce a copper concentration and increase or maintain a magnesium concentration in an oxide layer formed using a plasma electrolytic oxidation process.

In some embodiments, the oxide layer having a reduced copper concentration and a maintained or increased magnesium concentration is exposed to a gas including a halide or a plasma including a halide to form magnesium halide thereby creating a protective layer having increased corrosion/erosion resistance on the object. The object may be a chamber wall of a plasma chamber or a semiconductor process chamber the exposure may occur while conducting a semiconductor fabrication process using the chamber.

FIG. 1A is a flow chart illustrating a method 100 for creating an oxide layer having a reduced copper concentration over a surface of an object that includes aluminum, copper and magnesium (e.g., an object for use in a semiconductor processing system), according to first illustrative embodiment. Initially, an object is provided that includes a bulk material with a bulk copper concentration of between about 0% and about 0.1% by weight and a bulk magnesium concentration greater than about 1.5% by weight (step 102). Throughout the specification, a concentration listed as a percentage refers to a percentage concentration by weight. Similarly a concentration listed in ppm refers to a concentration in parts per million by weight. A surface of the object is oxidized using a plasma electrolytic oxidation (PEO) process (step 106), which produces an oxide layer on the surface of the object that includes magnesium oxide disposed therein. The PEO process creates a dense oxide layer that protects the underlying bulk material of the object. The oxide of magnesium in the oxide layer may be converted or at least partially converted to magnesium halide during further processing of the object.

Figure 1B:
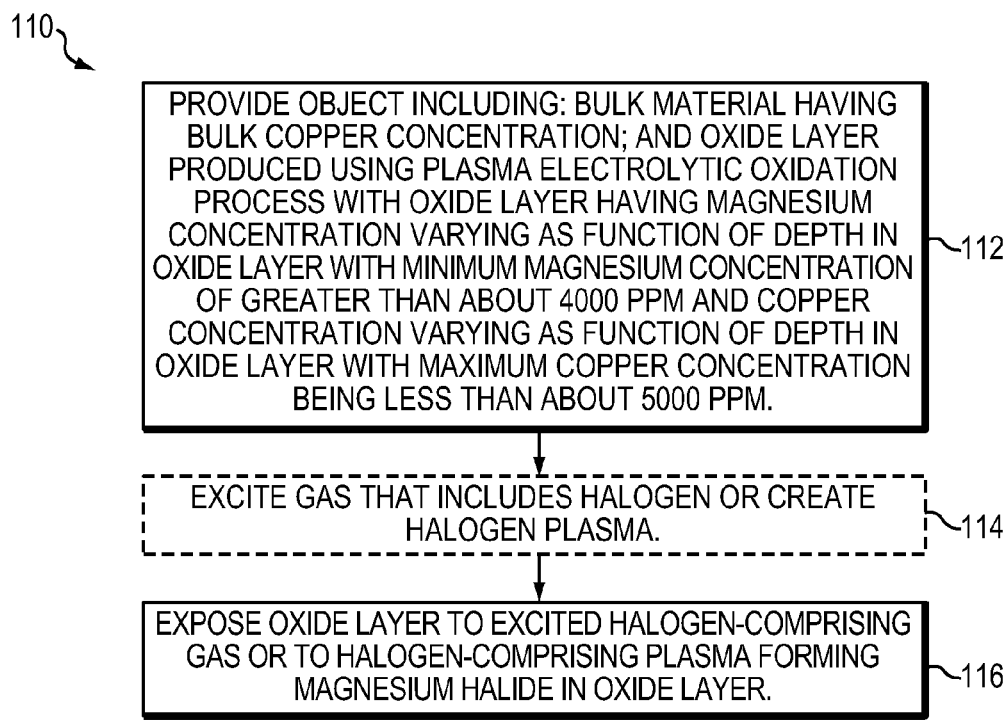
FIG. 1B is a flow chart illustrating a method of creating a protective layer having a reduced copper concentration that includes an oxide produced using a PEO process and magnesium halide, according to an illustrative embodiment.

For example, FIG. 1B is a flow chart illustrating a method of creating a protective layer over a surface of an object that includes forming magnesium halide. An object, such as a material for used in a plasma chamber, is provided that has a bulk material with a bulk copper concentration, and an oxide layer produced using a PEO process (step 112). The oxide layer has a copper concentration that varies as a function of depth with a maximum copper concentration in the oxide layer being less than about 5000 ppm in some embodiments. In other embodiments, the maximum copper concentration in the oxide layer is less than about 4000 ppm. The oxide layer has a magnesium concentration that also varies as a function of depth with a minimum magnesium concentration in the oxide layer being greater than about 4000 ppm. At least some of the magnesium in the oxide layer is in the form of a magnesium oxide. In some embodiments, the method can include exciting a gas including a halide (a "halide-comprising gas") or creating a plasma including a halide (a 'halide-comprising plasma") (step 114). In step 116, at least some of the magnesium in the oxide layer is changed into magnesium halide by exposing the oxide layer to an excited halide-comprising gas or to a halide-comprising plasma, thereby creating the protective layer. The magnesium halide formed in the oxidized layer (i.e., the protective layer) increases the corrosion/erosion resistance of the object.

Before explaining the importance of the composition of the object provided in step 102, processes using plasma electrolytic oxidation (step 106) are explained. Plasma electrolytic oxidation (abbreviated as PEO and also referred to as micro arc oxidation) is a term describing electrochemical processes for creating an oxide layer on the surface of metals. In a PEO process an oxide layer is created by immersing a metal substrate (e.g., an aluminum alloy) in a low concentrate alkaline electrolytic solution and passing a pulsed AC current through the electrolytic solution. A plasma discharge is formed on the substrate surface in response to the pulsed AC current. The discharge converts the metal surface into a dense, hard oxide (e.g., predominantly alumina or aluminum oxide in the case where the substrate is aluminum). An elemental co-deposition process occurs simultaneously. As described in greater detail below, the process incorporates other alloy elements from the substrate into the oxidized layer (e.g., drawing copper (Cu) and magnesium (Mg) from the aluminum alloy substrate into the oxidized layer). The concentration of Cu and Mg in the PEO oxidized layer will depend on several factors, such as, for example, diffusion rates of Cu and Mg in the forming oxide, concentrations of Cu and Mg in the substrate, kinetics of available Cu and Mg for inclusion in the oxide, and electric field intensity in the oxide. Because elements from the substrate are incorporated into the oxide layer, the chemical composition of the oxide layer may be affected by the chemical composition of the underlying substrate. A substantially thick, uniform oxide coating is typically formed over the surface of the substrate in response to the electrochemical and physical reactions occurring in the PEO process. The oxide layer or oxide coating formed using a plasma electrolytic oxidation process may be referred to as a PEO layer or a PEO coating herein. The thickness of a PEO layer used to protect a surface in a plasma chamber or in a semiconductor process chamber is typically between about 1 micron and 100 microns in thickness, but the thickness of the layer may fall outside this range as embodiments are not limited in this respect.

In general, an oxide layer formed using a PEO process primarily consists of three layers: an external layer, a partially crystallized layer, and a transition layer. The external layer occupies approximately 30%-40% of the total thickness of the oxide layer. The partially crystallized layer is located between the external layer and the transition layer. The transition layer is a thin layer located directly on the metal substrate. Various electrolytic solutions can be used to form the dense oxide layer in a PEO process. Some PEO processes are commercially available. One supplier that offers the process as a service is Keronite International Ltd. (Granta Park, Great Abington, Cambridge, CB21 6GP, UK).

In comparison with an oxide layer formed on the surface of a metal using a conventional anodization process, PEO creates a harder, less porous and more corrosion/erosion resistant layer. In comparison with conventional anodization carried out using low electrical potentials (typically several tens of volts), PEO involves the application of high electrical potentials (typically several hundreds of volts). The high electrical potentials applied in plasma electrolytic oxidation result in electrical discharges that produce a plasma at the surface of the object. The plasma modifies and enhances the structure of the oxide layer. During PEO, the oxide grows outward from the original metal surface of the object and inward from the original metal surface by converting the metal in the object into oxide. As a result, elements within the metal are more easily incorporated into the PEO processed oxide than through the conventional anodization process.

After forming the PEO layer, method 110 can include (i.e. optional step) exciting a gas that includes a halogen or producing a plasma that includes a halogen in step 114. The excited gas may form a plasma or be produced by a plasma. Halogens (or halogen elements) are nonmetal elements from group VII and VIIA of the periodic table (e.g., fluorine). Exemplary halogen-comprising gases useful in embodiments include, for example, $NF_3$, $F_2$, $CF_4$, $C_2F_6$, $C_3F_8$, $SF_6$, $Cl_2$, $ClF_3$, and $Br_2$ and BrCl. The halogen-comprising gas may be excited using a reactive gas generator (e.g., the reactive gas generator of FIG. 8A). As an alternative to step 114, a halogen-comprising gas or plasma can be provided.

In step 116, the oxidized surface of the object is exposed to the halogen-comprising plasma and/or the excited halogen-comprising gas. When the oxide layer of the object is exposed to the halogen-comprising plasma or excited halogen-comprising gas, alloy elements in the oxide layer react with the halogen-comprising plasma or excited halogen-comprising gas. In an example embodiment, the excited gas includes fluorine and the object includes an aluminum alloy with magnesium and copper. As described above, during the PEO process, magnesium from the aluminum alloy in the bulk of the object is drawn into the oxide layer forming oxides of magnesium. When the oxide layer, which includes oxides of magnesium, is exposed to an excited gas comprising fluorine or a plasma comprising fluorine, the magnesium oxides react with the fluorine to form magnesium fluoride ($MgF_2$) in the oxide layer. During exposure to the excited fluorine-comprising gas or fluorine-comprising plasma, aluminum oxides are removed by the gas or plasma, which increases the concentration of magnesium fluoride or magnesium oxide relative to the concentration of aluminum oxides. The magnesium fluoride forms diffusion bonds with adjoining material layers of the object and encapsulates and protects aluminum and aluminum oxide on the surface of the object from exposure to the fluorine-comprising gas. The magnesium fluoride inhibits the penetration of additional fluorine into the oxide layer and provides protection for the oxide layer and the base aluminum alloy.

In some embodiments, the protective layer is created over a surface of an object that is part of an interior surface of a plasma reactor running a halogen-based process. For example, generating a plasma or an exciting gas that includes halogen (step 114) and/or exposing the oxidized surface of the object to the halogen-comprising plasma or excited gas (step 116) can occur while running the halogen-based process. Performing these steps while running a halogen-based process may permit formation of the magnesium halide in the oxide coating and then use of the object in a semiconductor processing system without needing to change or reconfigure the system.

At least portions of a protective layer forming a surface of a wall of a chamber, such as a plasma chamber or a semiconductor processing chamber, may be gradually removed (i.e., eroded) when exposed to corrosive conditions during use. This means that different depths of the original protective layer will form the surface of the chamber wall and be exposed to an interior of the chamber over time as the protective layer is gradually removed. Thus, the risk of copper contamination at a particular point in time depends on the copper concentration that is exposed at the surface of the protective layer at that point in time. Although the protective layer is not removed or "lost" at a uniform rate at all exposed areas of the chamber wall, portions of the chamber wall will likely experience the same rate of loss or removal of the protective layer. If the concentration of copper in the protective layer has a maximum, which corresponds to a particular depth, the highest risk of copper contamination will occur when that particular depth of the protective layer is exposed as the surface of the chamber wall. Thus, maintaining an acceptably low risk of copper contamination over the working lifetime of a protective coating on a chamber wall involves reducing the maximum copper concentration at least in portions of the protective layer that may be exposed during the working lifetime of the protective layer.

Figure 2A:
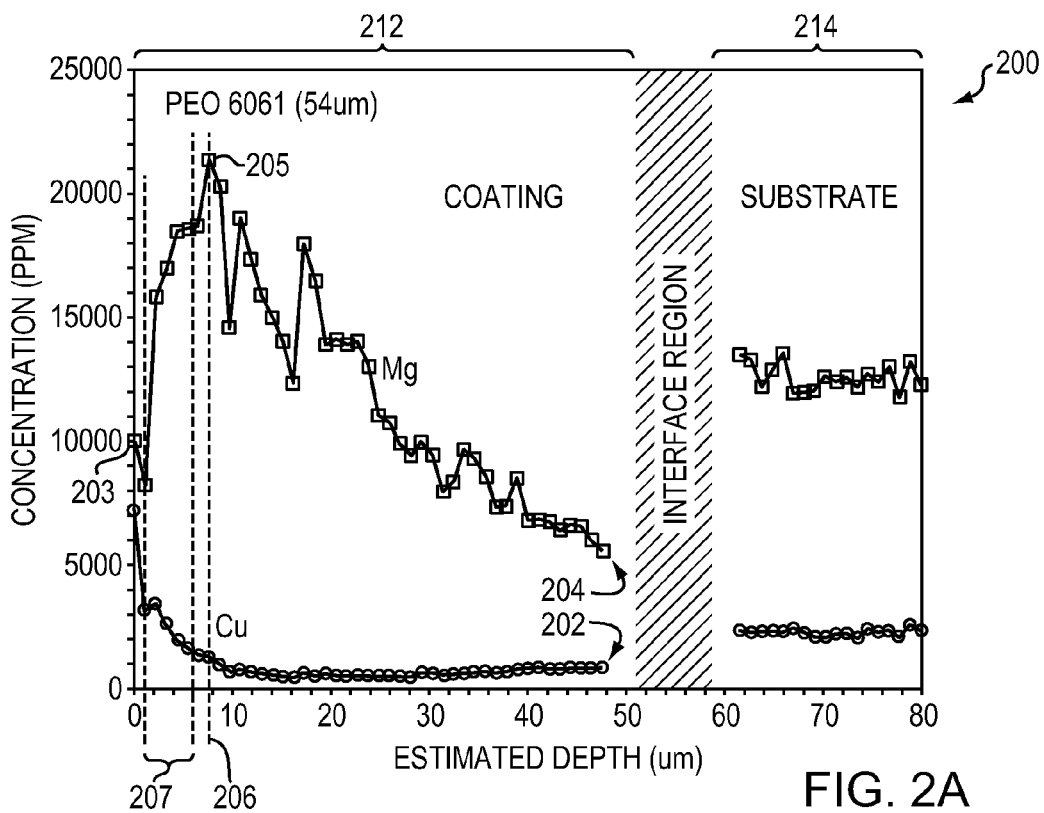
FIG. 2A is a graph of concentrations of copper and of magnesium as functions of depth from a surface of an oxide layer formed by plasma electrolytic oxidation on an object of aluminum alloy 6061 as measured using laser ablation inductively coupled plasma mass spectroscopy (LA-ICP-MS).

The graph 200 in FIG. 2A shows concentrations of copper and magnesium as a function of depth in a sample (Sample A) made of aluminum 6061 alloy (Al 6061) with an oxide coating formed using a plasma electrolytic oxidation process by Keronite International Ltd. Al 6061, which is a commonly used alloy for walls of deposition chambers, includes between about 0.15% and about 0.40% copper and between about 0.8% and about 1.2% magnesium. The PEO process resulted in an oxide layer about 54 μm thick as measured using a DualScope® MP20 thickness measurement unit manufactured by Fischer Technology, Inc. (Windsor, Conn.). The oxide layer includes oxides of magnesium and copper.

In graph 200 the concentration of copper 202 (circles) and of magnesium 204 (squares) in parts per million (ppm) are shown as a function of depth in the oxide layer (coating) and in the bulk (substrate) of Sample A as measured using laser ablation inductively coupled plasma mass spectroscopy (LA-ICP-MS). In a coating portion 212 of the graph, the concentrations are shown in parts per million by weight of the oxide layer material (i.e., concentration measurements that correspond to the oxide layer of the sample). In a substrate portion 214 of the graph, the concentrations are shown in parts per million by weight of the bulk material (i.e., concentration measurements that correspond to the bulk aluminum alloy of the sample). The concentration of copper in the bulk (substrate) of Sample A is about 2500 ppm (about 0.25%). In contrast, the maximum copper concentration 203 in the oxide layer, which occurs at the surface of the oxide layer, is about 7000 ppm (about 0.7%), which is more than twice the concentration of copper in the bulk. This maximum concentration of copper occurring at the surface of the oxide layer increases the risk of copper contamination to an unacceptable level for many semiconductor processing applications.

Sample A also has an increased concentration of magnesium at the surface of the oxide layer. The maximum magnesium concentration 205 in the oxide layer of 21,000 ppm (about 2.1%) is about 1.7 times the magnesium concentration in the bulk material, which is about 12,000 ppm (about 1.25%). The maximum magnesium concentration is located at a depth of about 8 microns from the surface of the oxide layer as indicated by line 206, unlike the maximum copper concentration, which is located at the surface of the oxide layer. Although the magnesium concentration in the oxide layer of Sample A enables formation of a protective layer magnesium halide when exposed to an excited halogen-comprising gas or halogen-comprising plasma, the high concentration of copper at the surface of the oxide layer increases the risk of copper contamination.

Figure 2B:
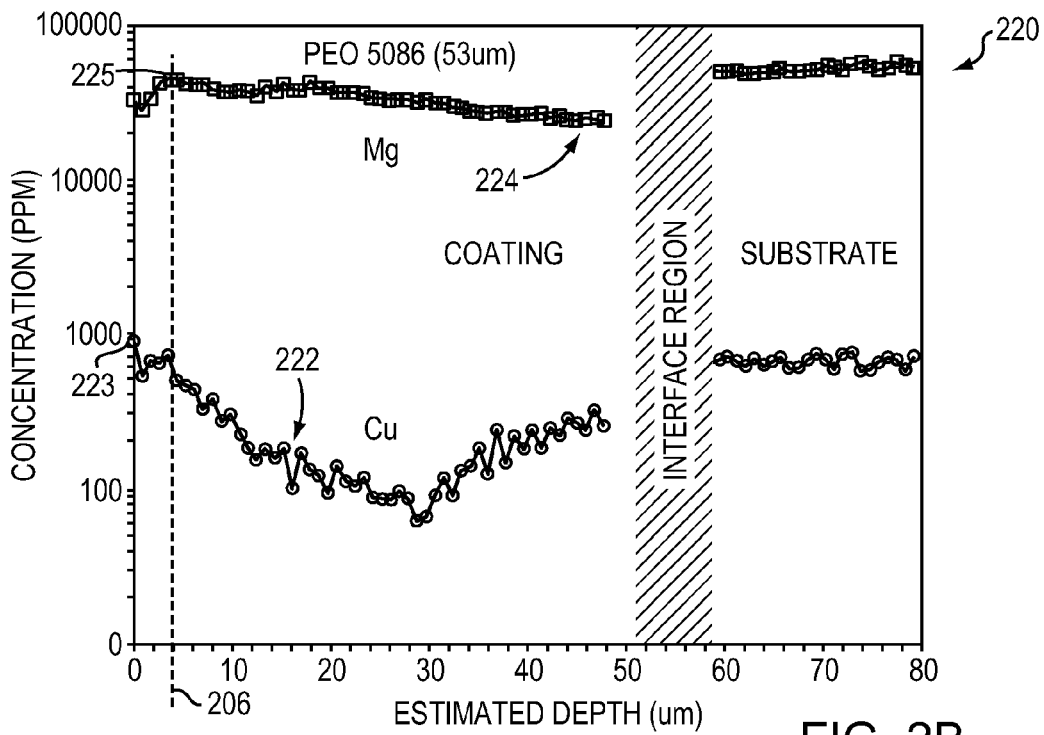
FIG. 2B is a graph of concentrations of copper and of magnesium as functions of depth from a surface of an oxide layer formed by plasma electrolytic oxidation on an object of aluminum alloy 5086, according to an illustrative embodiment.

One method of creating an oxide layer having a reduced copper concentration on an object includes reducing the source of the copper by reducing the copper concentration in the object before oxidation. For example FIG. 2B shows a graph 220 of copper concentration 222 and magnesium concentration 224 as a function of depth for Sample B, which includes a protective coating made in accordance with method 100 depicted in FIG. 1A. Sample B was formed from a 5086 aluminum alloy. A 5086 aluminum alloy has a copper concentration of between about 0% and about 0.1% and a magnesium concentration of between about 3.5% and 4.5%. As shown in FIG. 2B, Sample B had bulk copper concentration of about 700 ppm or about 0.07% and a bulk magnesium concentration of about 45000 ppm or about 4.5% Thus, sample B had a bulk Cu concentration falling in the range of about 0% and about 0.1% and a bulk magnesium concentration greater than about 1.5% as specified in step 102 of method 100. Sample B was then processed using conditions substantially similar to those used to process Sample A. Sample B was processed using a plasma electrolytic oxidation process by Keronite International Ltd. to form an oxide layer (step 106) about 53 nm thick as measured using the DualScope® MP20 thickness measurement unit.

For Sample B, the maximum copper concentration 223 is about 1000 ppm (about 0.1%), which occurred at the surface of the oxide layer and was seven times smaller than the maximum concentration of copper at the surface of the oxide layer for Sample A. Thus, the risk of copper contamination from Sample B is much smaller than the risk of copper contamination from Sample A. The magnesium concentration 225 of the oxide layer in Sample B had a maximum value of about 42500 ppm (about 4.25%) at a depth of about 4 microns as indicated by line 226 and decreased with increasing depth until reaching about 22000 ppm (about 2.2%) at the interface between the oxide layer and the bulk material. The oxide layer of Sample B had a range of magnesium concentrations sufficiently high to form protective magnesium halide when exposed to an excited halide-comprising gas or a halide-comprising plasma.

Figure 3A:
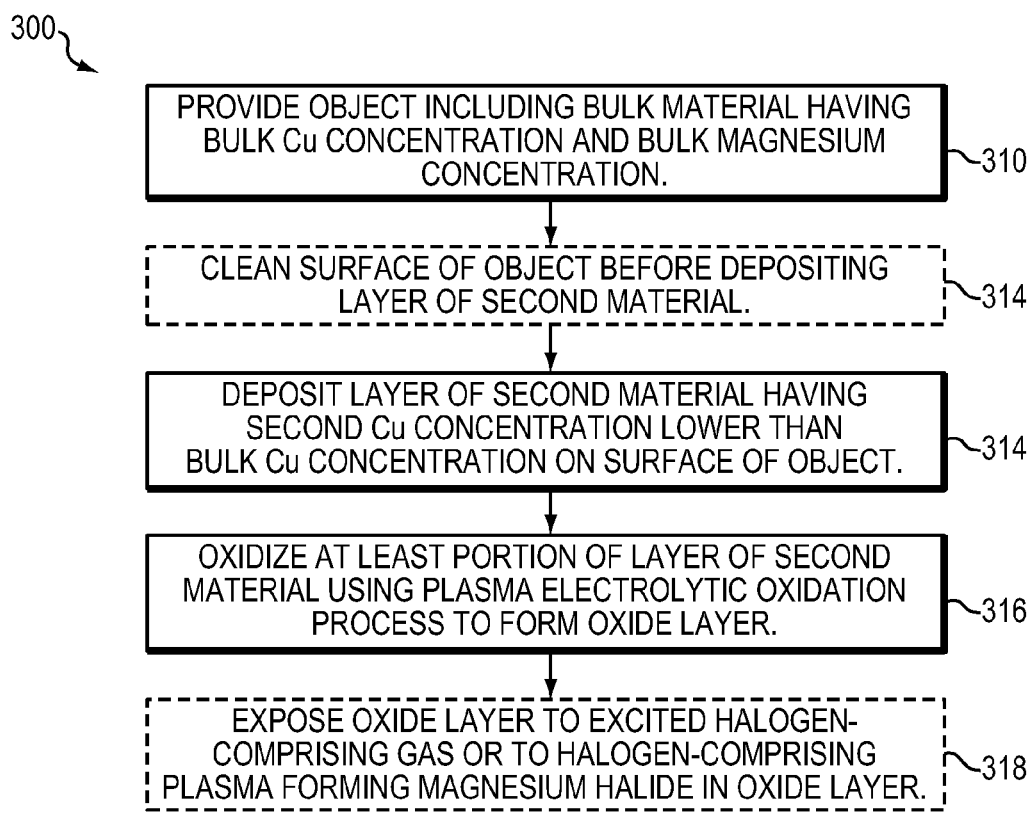
FIG. 3A is a flow chart illustrating a method of creating an oxide layer over a surface of an object that includes depositing a second material on a surface of the object and oxidizing at least a portion of the layer of second material using PEO, according to an illustrative embodiment.
Figure 3B:
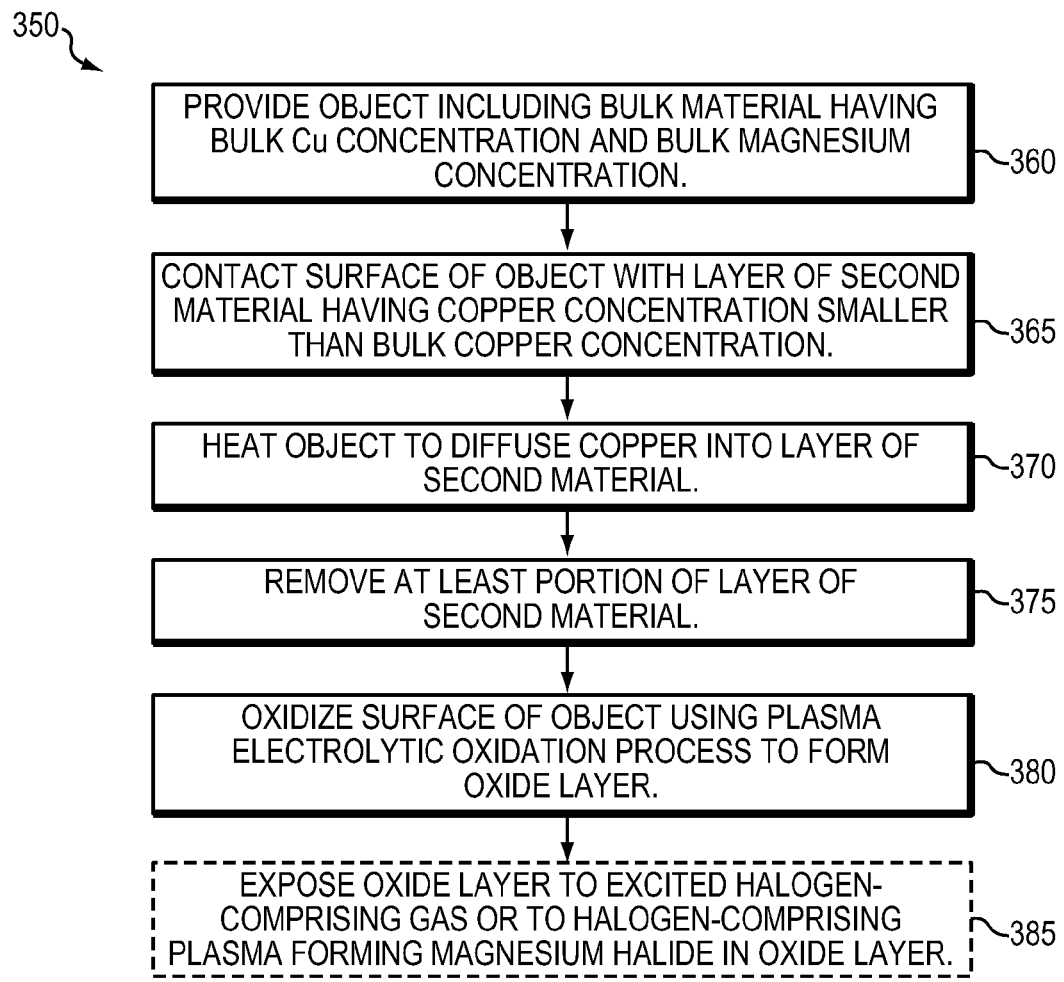
FIG. 3B is a flow chart illustrating a method of creating an oxide layer over a surface of an object that includes depositing a second material on a surface of the object, heating the object to diffuse copper into the layer of second material, and removing the layer of second material before oxidizing the object using PEO, according to an illustrative embodiment.

In some circumstances, a composition of aluminum that produces an oxide layer with a sufficiently low copper concentration and a sufficiently high magnesium concentration has properties or qualities (e.g., high cost, particular mechanical properties, etc.) that make it undesirable for use as the bulk material for the object. In some embodiments, a material having a lower copper concentration than the bulk copper concentration is deposited on the object to form a layer of low copper concentration material before oxidation, which produces a PEO oxide layer having a maximum copper concentration significantly lower than the bulk copper concentration. For example, FIG. 3 depicts another method 300 for forming a protective layer on an object.

Initially, an object is provided that includes an aluminum bulk material and a bulk copper concentration (step 310). A second material is deposited on the surface, where the second material has a second copper concentration lower than the bulk copper concentration (step 314). The second material may be deposited in a variety of ways and using a variety of known methods. For example, the second material may be deposited by thermal vapor deposition. Examples of other methods include, but are not limited to, chemical vapor deposition, plasma vapor deposition, plasma spray and ablative transfer. The second material may be deposited in a layer significantly thicker than the final thickness of the oxide layer, in a layer about the same thickness as the final thickness of the oxide layer or in a layer thinner than the final thickness of the oxide layer as embodiments are not limited in this respect. In some embodiments, a surface of the object may be cleaned or otherwise prepared (step 314) before deposition of the second layer of material.

At least a portion of the second layer of material is oxidized using a plasma electrolytic oxidation process (step 316). In some embodiments, only a portion of the second layer of material is oxidized. In other embodiments, an entire thickness of the second layer of material is oxidized. In still other embodiments, an entire thickness of the second layer is oxidized and the oxidation extends into the underlying bulk material. The reduced copper concentration in the layer of second material limits the amount of copper available to be incorporated into the oxide layer during PEO in step 316. Thus, the method produces an oxide layer having a reduced copper concentration.

In some embodiments, the second material includes a magnesium concentration higher than a magnesium concentration in the bulk, which increases an amount of magnesium available to be incorporated into the oxide during PEO in step 316. In other embodiments, the concentration of magnesium in the second layer is raised by depositing a third material comprising magnesium or by doping the second layer (i.e.. the layer with a reduced copper concentration) with magnesium before oxidizing at least a portion of the second layer. The magnesium oxides present in the oxide layer permit formation of magnesium halide if the oxide layer is later exposed to an excited halide-comprising gas or a halide-comprising plasma. Optionally, method 300 can further include exposing the object to an exited halide-comprising gas or to a halide comprising plasma to form a protective layer having magnesium halide (step 318).

In some embodiments, in which a second material is deposited on the object, a bulk copper concentration may be relatively high (e.g., greater than about 0.1%) and/or a bulk magnesium concentration may be relatively low (e.g., less than about 1.5%). Thus, the result of using a PEO process to oxidize the second material provides an oxide layer having a relatively low copper concentration and a relatively high magnesium concentration on a bulk material having a relatively high copper concentration and a relatively low magnesium concentration.

In other embodiments, the bulk copper concentration be relatively low (e.g., less than about 0.1%), but still higher than the copper concentration of the second material. Similarly, the bulk magnesium concentration may be relatively high (e.g., greater than about 1.5%), but still lower than the magnesium concentration of the second material. For example, aspects of method 300 may be incorporated in method 100. Returning briefly to FIG. 1, method 100 can optionally include depositing a layer of a second material having a reduced copper concentration relative to the bulk copper concentration on the surface of the object before forming an oxide layer using a PEO process (step 104).

In other embodiments, a copper concentration is reduced in at least a surface portion the object before the surface of the object is oxidized. For example, in method 350, an object having a bulk copper concentration and a bulk magnesium concentration is provided (step 360 of FIG. 3B). The object is contacted with a layer of second material that has a lower copper concentration than the bulk copper concentration (step 365), which creates a concentration gradient between the layer of second material and the bulk material of the object. In some embodiments, the layer of second material is deposited or formed on the surface of the object, thereby contacting the object with the deposited or formed layer of second material. In other embodiments, the layer of second material is preformed and is put in contact with the surface of the object.

While the object and the layer of second material are in contact, the object is heated to diffuse copper from the bulk material of the object in to the layer of second material (step 370). This reduces the concentration of copper in the bulk material at least in a region that is near the second layer (i.e., surface of the bulk material). In some embodiments, diffusion of magnesium from the bulk material into the layer of second material is avoided by heating at a temperature too low to cause diffusion of magnesium on a production time scale and/or by heating for too short a time to cause diffusion of magnesium on a production time scale.

At least a portion of the second layer of material is then removed from the surface of the object (step 375). In some embodiments, an entire thickness of the second layer of material may be removed. This leaves the object with the bulk material having a decreased copper concentration near the object's surface. The surface of the object is oxidized using a plasma electrolytic oxidation process (step 380) forming an oxide layer including alumina and a magnesium oxide. In some embodiments, the oxide layer of the object can later be exposed to an excited halogen-comprising gas or a halogen comprising plasma to form magnesium halide on the oxide layer (step 385). In some embodiments, the layer of second material may be removed by separating some or all of the layer of second material from the bulk material of the object (e.g., by physically removing some or all of the layer of second material relative to the bulk, cutting some or all of the layer of second material away from the bulk, etc.). In other embodiments, some or all of the layer of second material may be chemically and/or mechanically removed (e.g., by polishing, etching, dissolving, etc.).

Figure 4:
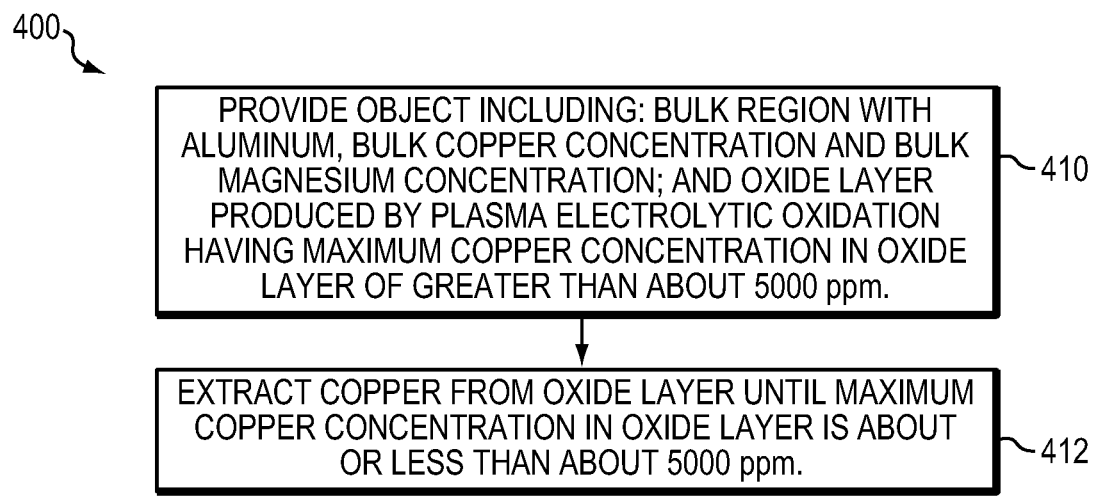
FIG. 4. is a flow chart illustrating a method of creating an oxide layer having a reduced copper concentration over a surface of an object where copper is extracted from the oxide layer after a plasma electrolytic oxidation process, according to an embodiment.

Other embodiments reduce a copper concentration in the oxide layer after the layer has been formed using a PEO process. For example, FIG. 4 illustrates a method 400 for treating a surface of an object. Initially, an object is provided that includes a bulk region and an oxide layer (step 410). The bulk region includes aluminum, a bulk copper concentration and a bulk magnesium concentration. The oxide layer was produced by a plasma electrolytic oxidation process and has a maximum copper concentration of greater than 5000 ppm. The oxide layer also has a magnesium concentration. Copper is extracted from the oxide layer until a maximum copper concentration in the oxide layer is about or less than about 5000 ppm (step 412). In some embodiments, copper is extracted from the oxide layer until the maximum copper concentration in the oxide layer is about or less than about 4000 ppm. In some embodiments, the copper may be extracted using a chemical process or an electrochemical process that dissolves copper into a solution. Examples of chemicals that may extract copper from the oxide layer include, but are not limited to $FeCl_3$, nitric acid and phosphoric acid. In an electrochemical process, an electric field is used to accelerate the diffusion and dissolution process. The dissolved copper can be deposited onto another surface to remove the copper from the solution.

In some embodiments, a maximum copper concentration is reduced in the oxide layer using diffusion or diffusion biased by an electrical potential gradient (called electromigration).

Figure 5A:
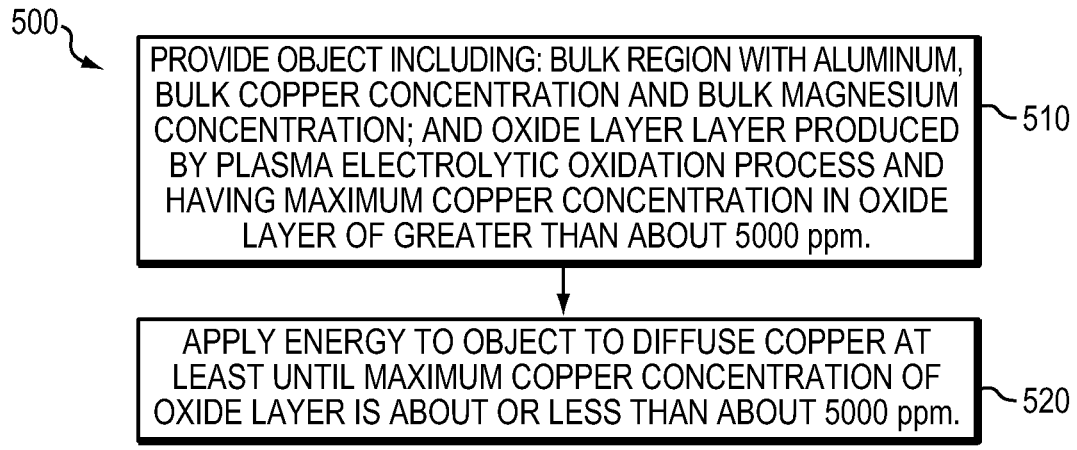
FIG. 5A. is a flow chart illustrating a method of creating an oxide layer having a reduced copper concentration over a surface of an object where energy is applied to the object to diffuse copper and reduce a maximum copper concentration in the oxide layer, according to an embodiment.

For example, FIG. 5A illustrates a method 500 for treating a surface of an object that reduces a maximum copper concentration in an oxide layer. An object is provided that has a bulk region including aluminum and a bulk copper concentration, and that has an oxide layer produced using a PEO process (step 510). The oxide layer has a copper concentration that varies as a function of depth with a maximum copper concentration greater than the bulk copper concentration. The oxide layer also has a magnesium concentration that varies as a function of depth. Energy is applied to the object to diffuse copper at least until the maximum copper concentration of the oxide layer is about or less than about 5000 ppm (step 520). In some embodiments, energy is applied to the object to diffuse copper at least until the maximum copper concentration of the oxide layer is about or less than about 4000 ppm.

Figure 5B:
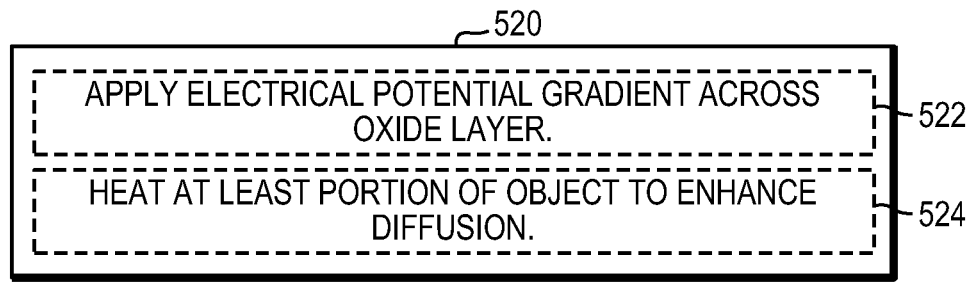
FIG. 5B. illustrates steps that can be included in applying energy to the object including applying an electrical potential gradient across the oxide layer, in accordance with aspects of an embodiment.
Figure 5C:
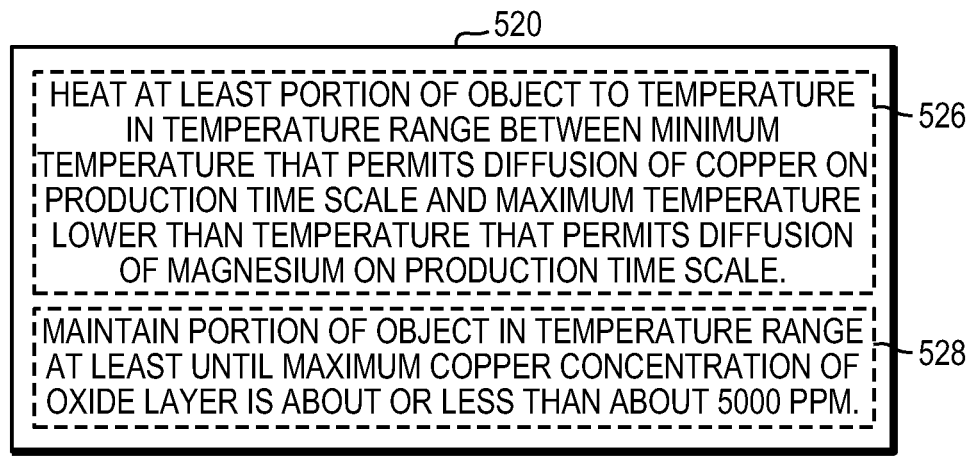
FIG. 5C. illustrates steps that can be included in applying energy to the object including heating at least a portion of the object, in accordance with aspects of an embodiment.

Energy may be applied to the object in step 520 using a variety of different methods and techniques. For example, applying energy to the object to diffuse copper may include applying an electrical potential gradient across the oxide layer (step 522) and/or heating at least a portion of the object to enhance diffusions (step 524) as shown in FIG. 5B. Heating at least a portion of the object increases (enhances) the rate of diffusion of the copper in the oxide layer. Applying the electrical potential gradient biases the diffusion resulting in electromigration of the copper in the oxide layer. In some embodiments, the electromigration can change the magnitude of the copper concentration maximum in the oxide layer and/or the depth at which the copper concentration maximum is located. In some embodiments, the electromigration may be used to drive copper out of the oxide layer and in to the bulk region.

In some embodiments, the electrical potential gradient may be established in a system used for anodization of an aluminum object. Reversing the electric field (i.e. making the bulk of the object a cathode) attracts the Cu+ ions in the oxide layer toward the bulk of the object. Applying an electrical potential across the oxide layer may further include providing an electrolyte adjacent the surface of the oxide layer for electrical connection to the surface of the object. Different types of electrolytes may be used. In some embodiments, the electrolyte is a conductive polymer in contact with surface of the oxide layer. The conductive polymer may be applied to the surface of the oxide layer. The electrolyte used for the reverse process can be selected to minimize or avoid reduction reactions due to the reversed electric field at the surface of the oxide layer.

In some embodiments the electrical potential gradient (e.g., electrical voltage) across the oxide layer is between about 300 V and about 1000 V. Because the voltage required may depend, at least in part, on the electrical characteristics of the oxide layer, the electrical potential may be described with respect to the breakdown voltage of the oxide layer, where the breakdown voltage of the oxide layer is the voltage at which the oxide layer fails (i.e., a voltage can no longer be supported across the layer). In some embodiments, the electrical voltage across the oxide layer is between about 30% and about 80% of the breakdown voltage of the oxide layer.

When the object is heated, the rate of diffusion of copper in the oxide layer and in the bulk is increased. With an applied electrical potential gradient, the rate that copper diffuses from the oxide layer into the bulk depends on both the temperature of the oxide layer and the magnitude of the electrical potential gradient applied across the oxide layer. In general, if the electrical potential gradient is increased while the temperature remains constant, the rate of copper diffusion from the oxide layer into the bulk increases. In general, if the temperature is increased while the electrical potential gradient remains constant, the rate of copper diffusion from the oxide layer into the bulk increases. If both the electrical potential gradient and the temperature are increased, the rate of copper diffusion from the oxide layer into the bulk increases even further. For some embodiments, the object is heated to a temperature between about 50 C. and about 350 C. while the electrical potential is applied. The desired temperature may vary with the electrical properties of the oxide layer and the magnitude of the electrical potential gradient applied.

As another example, applying energy to the object to diffuse copper may include heating at least portion of object to temperature in a desired temperature range (step 526) and maintaining at least a portion of the object in the desired temperature range temperature range at least until the maximum the copper concentration of the oxide layer is about or less than about 5000 ppm (step 528). In some embodiments, at least a portion of the object is maintained in the desired temperature range at least until the copper concentration of the oxide layer is about or less than about 4000 ppm. The desired temperature range lies between a minimum temperature that permits diffusion of copper on a production time scale and maximum temperature that does not permit significant diffusion of magnesium on production time scale. Thus, a temperature in the desired temperature range is a temperature at which copper diffusion in the oxide layer occurs, but magnesium diffusion in the oxide layer does not substantially occur on a production time scale. In an embodiment the desired temperature range may be between about 150 C. and 350 C.

Figure 6:
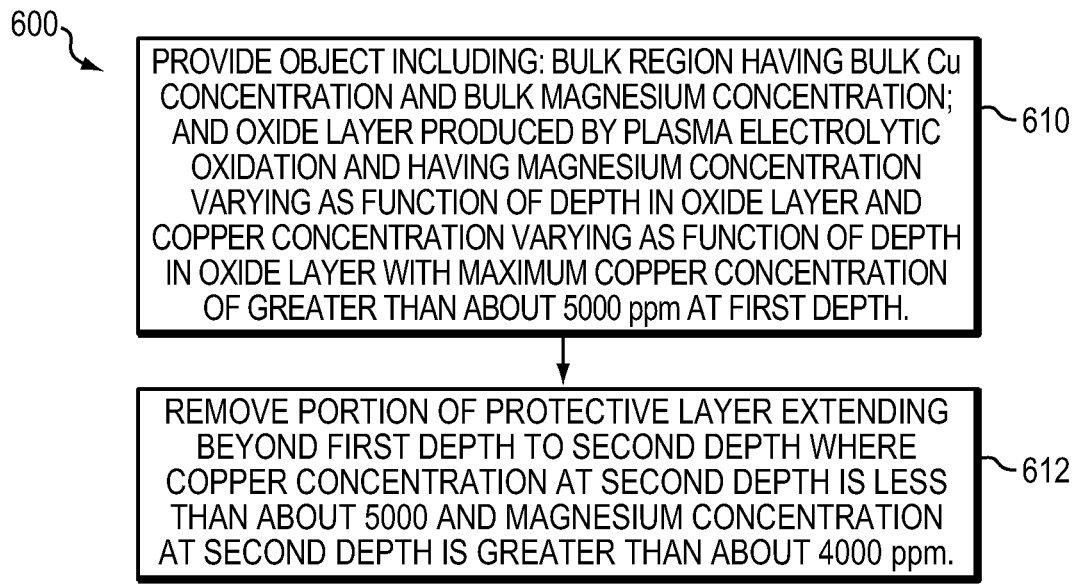
FIG. 6. is a flow chart illustrating a method of creating an oxide layer having a reduced copper concentration by removing at least a portion of the oxide layer, according to another embodiment.

In some embodiments, a maximum copper concentration in the oxide layer is decreased by removing a portion of the oxide layer. Because the maximum copper concentration usually occurs at or close to a surface of the oxide layer, removing an outer portion of the oxide layer can significantly decrease the maximum copper concentration in the layer. Unfortunately, the highest magnesium concentration usually occurs only slightly deeper than the maximum copper concentration in the oxide layer. Removing a larger portion of the oxide layer may further reduce the maximum copper concentration, but removing a larger portion further reduces the corrosion/erosion resistance of the oxide layer both because the thickness of the oxide layer is reduced and because maximum magnesium concentration in the oxide layer may be reduced. FIG. 6 depicts a method 600 for treating a surface of an object that includes aluminum, copper and magnesium for use in a semiconductor processing system. In step 610 an object is provided that includes a bulk region having bulk copper concentration and bulk magnesium concentration and oxide layer produced by plasma electrolytic oxidation. The oxide layer has a magnesium concentration that varies as a function of depth and a copper concentration that varies as a function of depth with a maximum copper concentration of greater than about 5000 ppm at a first depth of the oxide layer. A portion of the oxide layer extending beyond the first depth to a second depth is removed from the oxide layer (step 612) where the copper concentration at the second depth is about or less than about 5000 ppm and the magnesium concentration at the second depth is greater than about 4000 ppm. In some embodiments, the copper concentration at the second depth is about or less than about 4000 ppm.

The outer portion of the oxide layer may be removed using any of a variety of different techniques. In some embodiments the portion of the oxide layer is removed using a mechanical process. In some embodiments the portion of the oxide layer is removed using a chemical-mechanical process. In some embodiments the portion of the oxide layer is removed using an electrochemical-mechanical process. In some embodiments, the portion of the oxide layer is removed using chemical etching.

Figure 7A:
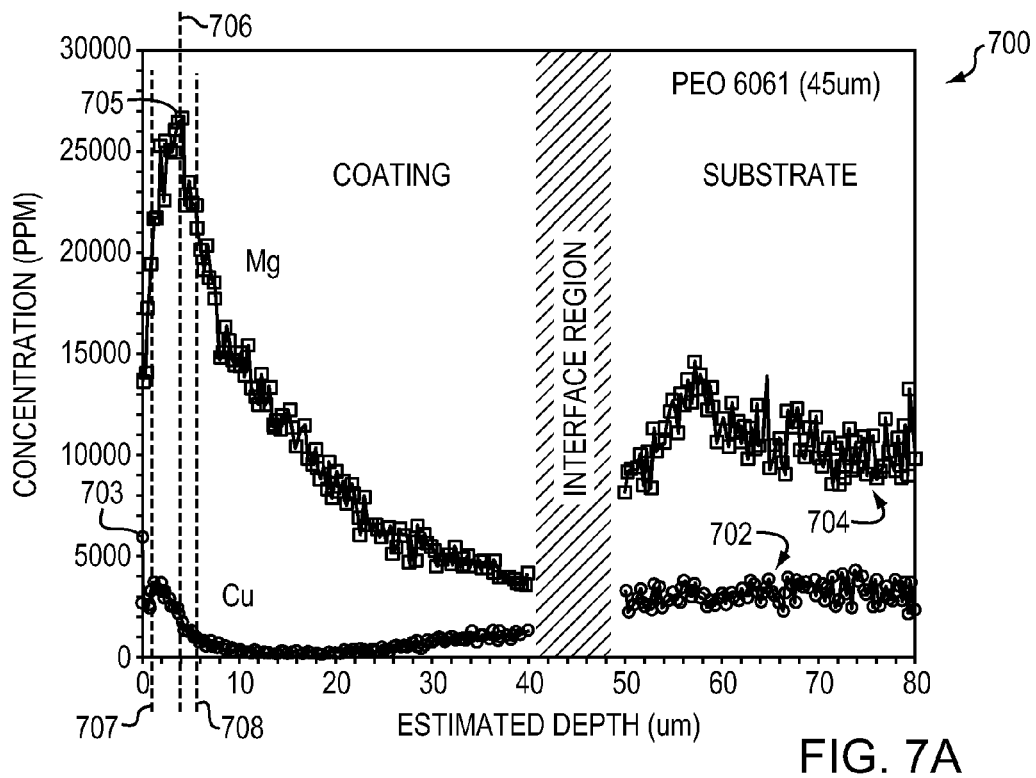
FIG. 7A is a graph of concentrations of copper and magnesium as functions of depth from a surface of an oxide layer about 45 microns thick formed by PEO on an object of aluminum alloy 6061.
Figure 7B:
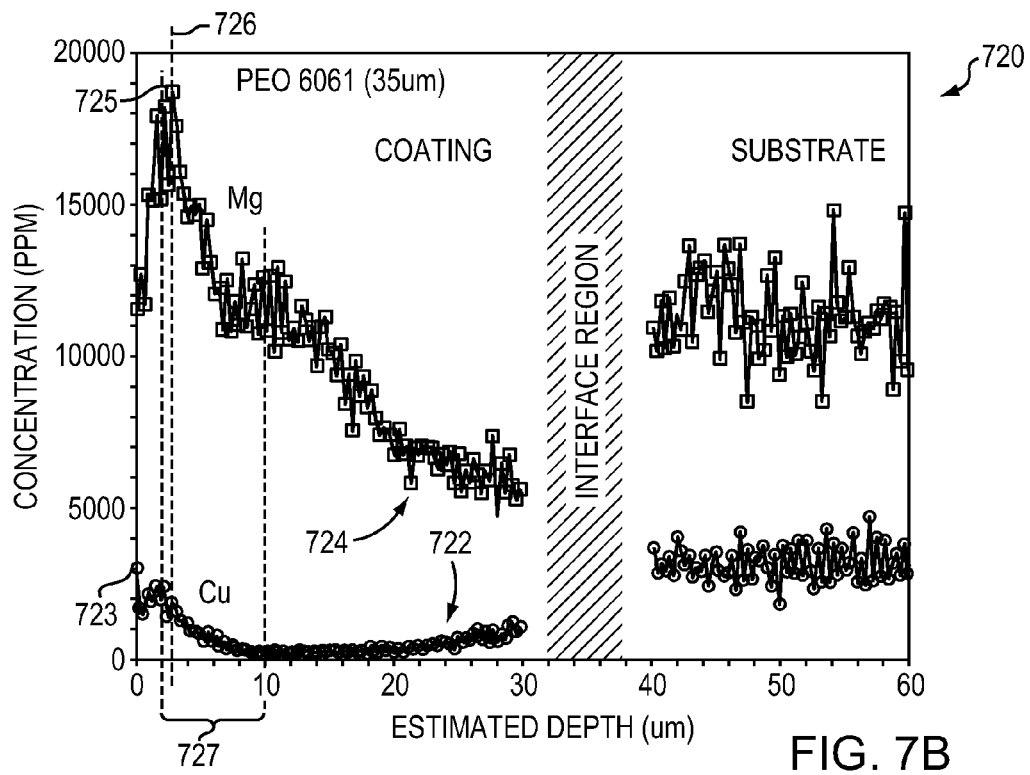
FIG. 7B is a graph of concentrations of copper and magnesium as a functions of depth from a surface of an oxide layer about 35 microns thick formed by PEO on an object of Al 6061.

The concentration of copper as a function of depth and the concentration of magnesium as a function of depth in the oxide layer may vary based on the total thickness of the oxide layer. For example, FIG. 7A shows a graph 700 of copper concentration 702 and magnesium concentration 704 as a function of depth for Sample C, which includes an oxide layer about 45 microns thick produced using a PEO process on material of an Al 6061 alloy. As shown, the copper concentration is a maximum 703 at the surface of the oxide layer and the magnesium concentration is a maximum 705 at a depth of about 4 microns as indicated by line 706. FIG. 7B shows a graph 720 of copper concentration 722 and magnesium concentration 724 as a function of depth for Sample D, which includes an oxide layer about 35 microns thick produced using about the same process as that used to produce Sample C on an object of the same alloy as Sample C. For Sample D, which has the thinner 35 micron thick oxide layer, the maximum copper concentration 723 occurs at the surface of the oxide layer like the maximum copper concentration for Sample C, but the maximum magnesium concentration 725 occurs at a depth of about 3 microns as indicated by line 726, unlike the maximum magnesium concentration for Sample C which occurred at a shallower depth. Returning briefly to FIG. 2A, the graph 200 for Sample A, whose oxide layer is 54 microns thick, showed a maximum copper concentration at the surface of the oxide layer and a maximum magnesium concentration at a depth of about 8 microns as indicated by line 726, which is deeper than the depth of the maximum magnesium concentration for the thinner oxide of sample C.

To provide a reduced copper concentration oxide layer that is still rich in magnesium, in one example involving Sample C, whose oxide layer is originally about 45 microns thick, removing 1 micron of oxide material, as indicated by dashed and dotted line 707, reduces the peak copper concentration to below 5000 ppm. In another example involving Sample C approximately 5 microns of oxide is removed as indicated by dashed and dotted line 708, reducing the peak copper concentration in the oxide layer to below 3000 ppm. In a further example regarding Sample D, whose oxide layer is originally about 35 microns thick, approximately 2 to 10 microns of the oxide layer is removed as indicated by dashed and dotted lines 727. In yet a further example involving Sample A, whose oxide layer is originally about 54 microns thick, approximately 1 to 6 microns of the oxide layer is removed as indicated by dashed and dotted lines.

Figure 8A:
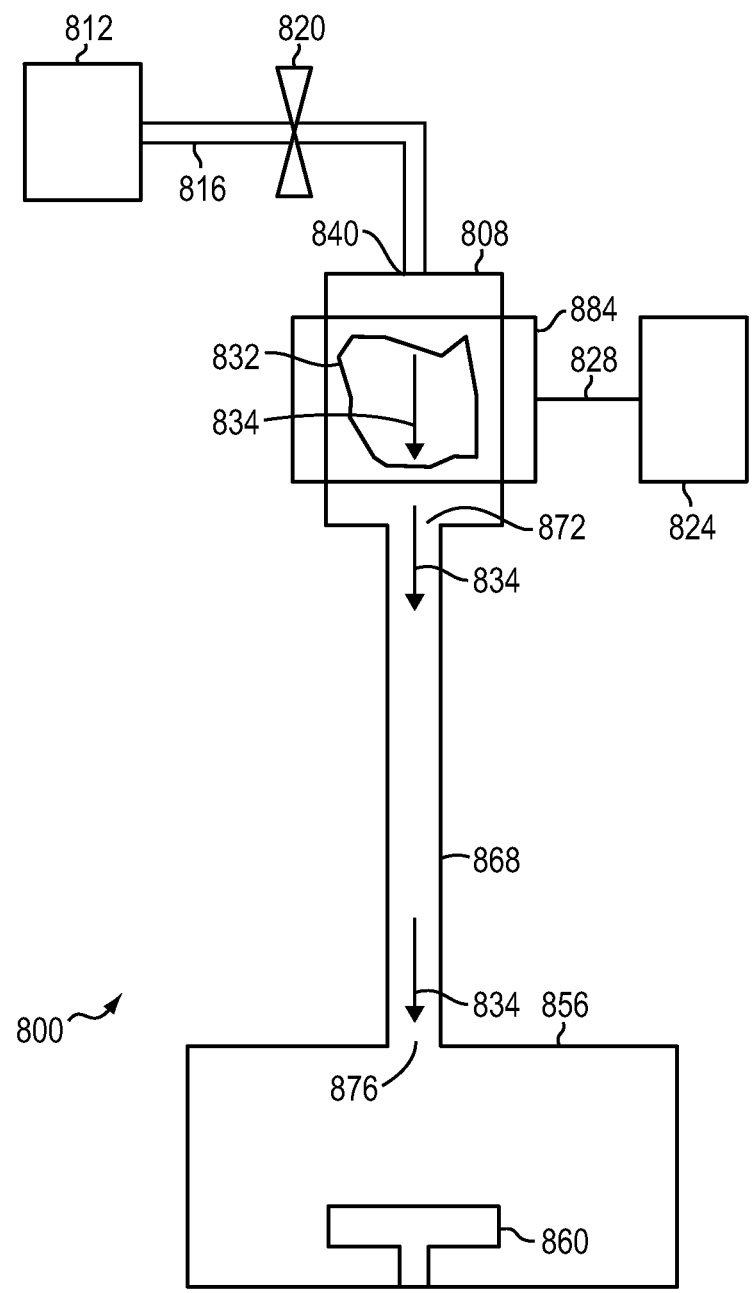
FIG. 8A is a schematic illustration of a reactive gas source used to perform a step in a process for creating a protective layer over a surface of a plasma chamber, according to an illustrative embodiment.

Embodiments described above were mostly directed to methods of making oxide layers over surfaces of objects and methods of treating objects. Additional embodiments include plasma chambers having plasma chamber walls with protective coatings and semiconductor process chambers having chamber walls with protective coatings, in accordance with other aspects of the invention. For example, FIG. 8A is partial schematic representation of a reactive gas generator system 800 for exciting gases that includes an exemplary plasma chamber. The reactive gas generator system 800 includes a plasma gas source 812 connected via a gas line 816 to an inlet 840 of the plasma chamber 808. A valve 820 controls the flow of plasma gas (e.g., $O_2$, $N_2$, Ar, $NF_3$, $F_2$, $H_2$ and He) from the plasma gas source 812 through the gas line 816 and into the inlet 840 of the plasma chamber 808. A plasma generator 884 generates a region of plasma 832 within the plasma chamber 808. The plasma 832 comprises the plasma excited gas 834, a portion of which flows out of the chamber 808. The plasma excited gas 834 is produced as a result of the plasma 832 heating and activating the plasma gas. The plasma generator 884 may be located partially around the plasma chamber 808, as shown.

The reactive gas generator system 800 also includes a power supply 824 that provides power via connection 828 to the plasma generator 884 to generate the plasma 832 (which comprises the excited gas 834) in the plasma chamber 808. The plasma chamber 808 can be formed or fabricated from, for example, a metallic material such as aluminum or a refractory metal, a dielectric material such as quartz or sapphire, or a coated metal such as anodized aluminum. In an embodiment, the plasma chamber has a plasma chamber wall including a bulk material (e.g., an aluminum alloy) with a bulk copper concentration and a bulk magnesium concentration and an oxide layer produced using a plasma electrolytic oxidation process. The oxide layer has a copper concentration that varies as a function of depth with a maximum copper concentration being about or less than about 5000 ppm and a magnesium concentration that varies as a function of depth with a minimum magnesium concentration being more than about 4000 ppm. In some embodiments, the maximum copper concentration is about or less than about 4000 ppm. In some embodiments, the magnesium in the oxide layer is converted to magnesium halide during use of the plasma chamber to generate a halide-comprising plasma or an excited halide-comprising gas.

The plasma chamber 808 has an outlet 872 that is connected via a passage 868 to an input 876 of a semiconductor process chamber 856. The excited gas 834 flows through passage 868 and into the input 876 of the process chamber 856. A sample holder 860 positioned in the process chamber 856 supports a material that is processed by the excited gas 834. The excited gas 834 may facilitate processing of a semiconductor wafer located on the sample holder 860 in the process chamber 856.

In yet another embodiment, the semiconductor process chamber 856 includes a substrate and an oxide layer over the substrate. The substrate includes a bulk material (e.g., an aluminum alloy) having a bulk copper concentration. The oxide layer is produced using a plasma electrolytic oxidation process and has a copper concentration that varies as a function of depth with a maximum copper concentration being about or less than about 5000 ppm and a magnesium concentration that varies as a function of depth with a minimum magnesium concentration being more than about 4000 ppm. In some embodiments, the maximum copper concentration is about or less than about 4000 ppm. In some embodiments, the magnesium in the oxide layer is converted to magnesium halide during use of the process chamber for processing involving exposure to a halide-comprising plasma or an excited halide-comprising gas. As noted above, the process chamber has an input or inlet for receiving an excited gas or a plasma.

The plasma source 884 can be, for example, a DC plasma generator, radio frequency (RF) plasma generator or a microwave plasma generator. The plasma source 884 can be a remote plasma source. By way of example, the plasma source 884 can be an ASTRON® remote plasma source manufactured by MKS Instruments, Inc. of Wilmington, Mass.

In one embodiment, the plasma source 884 is a toroidal plasma source and the chamber 808 is a chamber made from an aluminum alloy that includes magnesium. In other embodiments, alternative types of plasma sources and chamber materials may be used.

The power supply 824 can be, for example, an RF power supply or a microwave power supply. In some embodiments, the plasma chamber 808 includes a means for generating free charges that provides an initial ionization event that ignites the plasma 832 in the plasma chamber 808. The initial ionization event can be a short, high voltage pulse that is applied to the plasma chamber 808. The pulse can have a voltage of approximately 500-10,000 volts and can be approximately 0.1 microseconds to 100 milliseconds long. A noble gas such as argon can be inserted into the plasma chamber 808 to reduce the voltage required to ignite the plasma 832. Ultraviolet radiation also can be used to generate the free charges in the plasma chamber 808 that provide the initial ionization event that ignites the plasma 832 in the plasma chamber 808.

The reactive gas generator system 800 can be used to excite a gas comprising halogen for use as described previously herein (e.g., with respect to step 114 of FIG. 1B). An object comprising aluminum, magnesium and copper can be processed using a plasma electrolytic oxidation process (e.g., step 116 of FIG. 1B) to oxidize at least one surface of the object forming an oxidized layer. In addition, one or more of the above described methods, techniques or processes for reducing the copper concentration is employed in the formation or processing of the oxidized layer.

In one embodiment, the oxidized object was installed in the plasma chamber 808 and exposed to the plasma 832. In one embodiment, an ASTRON®ex remote plasma source manufactured by MKS Instruments, Inc. of Wilmington, Mass. was used as the plasma source 884. The oxidized object was exposed to a $NF_3$ plasma generated by the plasma source to produce magnesium fluoride on the surface. The $NF_3$ flow rate was 3 slm and chamber pressure was 2.9 torr. The electric power provided to the plasma was approximately 6.5 kW.

In another embodiment, the reactive gas generator system 800 is used to excite a gas comprising halogen for use as described previously herein (e.g., with respect to step 114 of FIG. 1B). In some embodiments, the plasma chamber 808 is the object that is processed using a plasma electrolytic oxidation process (e.g., step 102 of FIG. 1A). In this embodiment, the plasma chamber 808 is constructed from an aluminum alloy that includes magnesium and copper. A plasma electrolytic oxidation process is used to create the oxide layer on the interior surfaces of the plasma chamber 808. One of the various disclosed methods, techniques or processes for reducing a copper concentration during the formation or subsequent processing of the oxide layer is employed. In some embodiments, after surfaces of the plasma chamber are oxidized, the plasma chamber 808 is then installed in the reactive gas generator system 800 for further processing to produce a protective coatin having magnesium halide.

For example, the plasma chamber can then be the object of method 110 depicted in FIG. 1B. The plasma gas source 812 provides $NF_3$ as the plasma gas to the plasma chamber 808. Plasma 832 is generated using the $NF_3$. The plasma 832 generates the excited plasma gas 834 in the chamber 808. The oxidized interior surfaces of the plasma chamber 808 are therefore exposed to the fluorine-comprising plasma 832 and excited gas 834 (which comprises fluorine). The oxidized surfaces of the plasma chamber 808 are exposed to the plasma 832 and excited gas 834, similarly as described above with respect to FIG. 2B. The magnesium oxide in the oxide layer on the walls of the plasma chamber 808 reacts with the fluorine to form magnesium fluoride ($MgF_2$) in the oxide layer.

The reactive gas generator system 800 may be used to create plasma 832 by exciting a gas comprising halogen. The interior surfaces of gas passage 868 and/or process chamber 856 are the objects processed using a plasma electrolytic oxidation process (e.g., step 116 of FIG. 2B). In this embodiment, the gas passage 868 and/or process chamber 856 are constructed from an aluminum alloy that includes magnesium and copper. A plasma electrolytic oxidation process is used to create the oxide layer on the interior surfaces of passage 868 or process chamber 856. One of the various methods, techniques or processes for reducing a copper concentration during the formation or subsequent processing of the oxide layer is employed. The plasma chamber 808 is installed in the reactive gas generator system 800. The plasma gas source 812 provides $NF_3$ (as the plasma gas) to the plasma chamber 808. Plasma 832 is generated using the $NF_3$. The plasma 832 generates the excited plasma gas 834 which subsequently flows through passage 868 and process chamber 856. The oxidized interior surfaces of the passage 868 and process chamber 856 are therefore exposed to the excited gas 834 (which comprises fluorine). The magnesium oxide in the oxide layer on the walls of the passage 868 and process chamber 856 reacts with the fluorine to form magnesium fluoride ($MgF_2$).

Figure 8B:
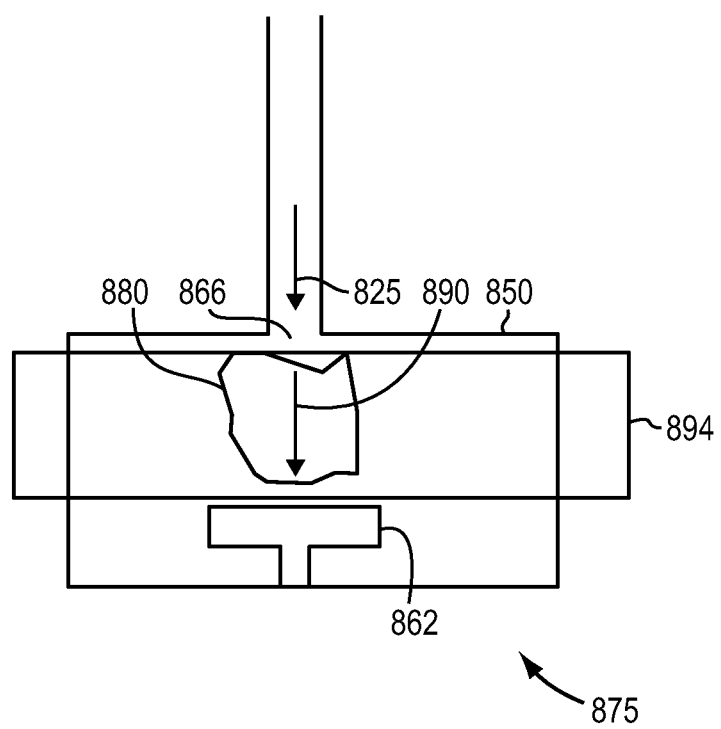
FIG. 8B is a schematic illustration of a reactive gas source used to perform a step in a process for creating a protective layer over a surface of a plasma chamber, according to an illustrative embodiment.

FIG. 8B is partial schematic representation of an in-situ plasma system 875. The plasma gas 825 (e.g., a gas comprising a halogen) is provided, via input 866, to the plasma chamber 850, which is also the process chamber. In the embodiment of FIG. 8B, the plasma chamber is also a process chamber. Other embodiments may include a plasma reactor that is remote from the process chamber.

In one embodiment, the process chamber 850 is constructed from an aluminum alloy that includes magnesium and copper. A plasma electrolytic oxidation process is used to create the oxide layer on the interior surfaces of process chamber 850. One of the various methods, techniques or processes for reducing a copper concentration during the formation or subsequent processing of the oxide layer is employed. The oxide layer has a copper concentration that varies as a function of depth with a maximum copper concentration being about or less than about 5000 ppm and a magnesium concentration that varies as a function of depth with a minimum magnesium concentration being more than about 4000 ppm. In some embodiments, the maximum copper concentration is about or less than about 4000 ppm.

In some embodiments, the process chamber 850 itself may be the object. A plasma 880 is generated inside the chamber 850 by a plasma reactor 894. A surface of the process chamber 850 has a PEO layer with a low or reduced peak copper concentration and a high or maintained magnesium concentration. A plasma 880 is generated inside the chamber 850 by a plasma reactor 894. The oxidized surface of the chamber 850 is exposed to the halogen-comprising plasma 880 and excited gas 890, as described above, forming a protective coating including magnesium halide.

In some embodiments, the process chamber is used for processing of a sample which is the object. A sample holder 862 positioned in the process chamber 850 supports a material that is processed by the plasma 880 and excited gas 890. In one embodiment, the object having a PEO oxide surface is placed on the sample holder 862 and exposed to the plasma 880 and/or excited gas 890. In the embodiment depicted in FIG. 8B, a plasma 880 is generated inside the chamber 850 by a plasma reactor 894. The object is constructed from an aluminum alloy that includes magnesium and copper. A plasma electrolytic oxidation process is used to create the oxide layer on the object. One of the various methods, techniques or processes for reducing a copper concentration during the formation or subsequent processing of the oxide layer is employed. The oxide layer has a copper concentration that varies as a function of depth with a maximum copper concentration being about or less than about 5000 ppm and a magnesium concentration that varies as a function of depth with a minimum magnesium concentration being more than about 4000 ppm. Exposure to the plasma and/or excited gas causes the magnesium oxide in the oxide layer on the surface of the object to react with the fluorine in the plasma and/or gas to foam magnesium fluoride.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

The invention claimed is:

1. A method of creating an oxide layer over a surface of an object comprising aluminum, copper and magnesium for use in a semiconductor processing system, the method comprising:
providing the object, the object comprising a bulk material having:
a bulk copper concentration between about 0% and about 0.1% by weight; and
a bulk magnesium concentration greater than about 1.5% by weight;
depositing a layer of a second material on the surface of the object, the second material having a second copper concentration less than the bulk copper concentration,
oxidizing the surface of the object using a plasma electrolytic oxidation process to form the oxide layer comprising alumina and an oxide of magnesium, the step of oxidizing the surface of the object using a plasma electrolytic oxidation process comprising oxidizing at least a portion of a thickness of the layer of second material; and
increasing a magnesium concentration of the layer of second material before formation of the oxide layer.

2. The method of claim 1, wherein the magnesium concentration of the layer of second material is increased through an ablative transfer of magnesium.

3. The method of claim 1, wherein the step of oxidizing the surface of the object using a plasma electrolytic oxidation process comprises oxidizing through and beyond a thickness of the layer of second material into underlying bulk material of the object.

4. The method of claim 1, further comprising cleaning the surface of the object prior to depositing the layer of second material.

5. A method for creating an oxide layer over a surface of an object comprising aluminum, copper and magnesium, the method comprising:
providing the object, the object including a bulk material having a bulk copper concentration by weight and a bulk magnesium concentration by weight;
depositing a layer of a second material on the surface of the object, the second material having a second copper concentration smaller than the bulk copper concentration;
oxidizing at least an outer thickness of the deposited layer of the second material using a plasma electrolytic oxidation process to form the oxide layer: and
increasing the magnesium concentration of the layer of the second material before formation of the oxide layer.

6. The method of claim 5, wherein the second material includes a magnesium concentration larger than the bulk magnesium concentration.

7. The method of claim 5, wherein oxidizing at least an outer thickness of the layer of second material using a plasma electrolytic oxidation process comprises oxidizing at least through an entire thickness of the deposited layer.

* * * * *